United States Patent
Coupland

(10) Patent No.: US 8,405,455 B2
(45) Date of Patent: Mar. 26, 2013

(54) AMPLIFIER AND METHOD FOR LINEARIZING SAME

(75) Inventor: John R. Coupland, Laguna Woods, CA (US)

(73) Assignee: EADS North America, Inc., Irvine, CA (US)

( * ) Notice: Subject to any disclaimer, the term of this patent is extended or adjusted under 35 U.S.C. 154(b) by 0 days.

(21) Appl. No.: 12/924,392

(22) Filed: Sep. 27, 2010

(65) Prior Publication Data

US 2012/0075015 A1 Mar. 29, 2012

(51) Int. Cl.
*H03F 1/36* (2006.01)

(52) U.S. Cl. .......................................... 330/86; 330/110
(58) Field of Classification Search ................. 330/86, 330/110

See application file for complete search history.

(56) References Cited

U.S. PATENT DOCUMENTS

| | | | | |
|---|---|---|---|---|
| 3,564,445 | A * | 2/1971 | Brokaw | 330/110 |
| 5,030,925 | A * | 7/1991 | Taylor | 330/308 |
| 7,388,959 | B2 * | 6/2008 | Gagon | 381/98 |
| 7,683,710 | B2 * | 3/2010 | Arnold | 330/103 |
| 8,098,094 | B2 * | 1/2012 | Gilbert | 330/144 |

* cited by examiner

*Primary Examiner* — Steven J Mottola

(57) ABSTRACT

An amplifier circuit and method are described for linearizing the gain of a voltage or current feedback amplifier that is non-linear.

17 Claims, 4 Drawing Sheets

US 8,405,455 B2

AMPLIFIER AND METHOD FOR LINEARIZING SAME

FIELD OF THE INVENTION

This invention relates in general to electronic circuits and more specifically to amplifiers and a method for linearizing amplifiers.

BACKGROUND

Amplifiers are used in a lot of different circuit designs such as in audio or analog circuits. One problem with some amplifiers such as operational amplifiers is that the amplifier's gain may not be linear over its operating amplitude range. This presents a problem for the circuit designer when using the non-linear amplifier in a system design since it is not easy to characterize the amplifier and is especially problematic when designing circuits such as test system circuits which require high levels of accuracy from the amplifier circuits.

A typical non-inverting feedback operational amplifier configuration is shown in FIG. 1. When the open-loop gain of the amplifier is very high, the voltage gain (G) of a voltage feedback amplifier is very closely expressed by the formula: G=1+Rf/Rg, wherein Rf is the resistance of resistor Rf, and Rg is the resistance of resistor Rg. The operational amplifier includes two differential input ports and an output port. The gain of an operational amplifier is generally set by Rf and Rg under the assumption that the open-loop gain of the amplifier is much higher (>10×) and that the input bias current is quite small, which is typical of a voltage feedback amplifier. Thus the open-loop gain of the amplifier would typically not affect the overall gain of the circuit. But if the open-loop gain of the amplifier is <10× of the programmed gain and the gain varies, then it could impact the overall circuit gain. A more likely scenario is the impact of the input bias current. In particular, a current feedback amplifier has significant input bias current on the inverting input, which can effectively put a non-linear resistive load on the inverting input. A current feedback amplifier may have a different formula as shown above due to the input impedance of the amplifier's inverting input.

For the sake of simplicity, let's assume FIG. 1 shows a voltage feedback amplifier. Thus, the gain for the amplifier in FIG. 1 would be 8 which is calculated by the using the above formula for gain G=(1+140/20). If we assume that this amplifier has a gain error because it is, in reality, non-linear, FIG. 2 shows a plot of Vout error as a function of the expected output voltage when going from −10V to +10V for the amplifier shown in FIG. 1. The error is quite small from −2V to +2V, but grows until the error is approximately 5% at −10V and +10V. This Vout or non-linear error presents a problem for a designer using this amplifier since the designer has to take into account the error or risk multiplying the error as a signal moves through a system. In view of the above, a need exists for a simple circuit for linearizing a non-linear amplifier and method for linearizing an amplifier in order to address one or more of the problems addressed above.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

DETAILED DESCRIPTION

Figure 1:
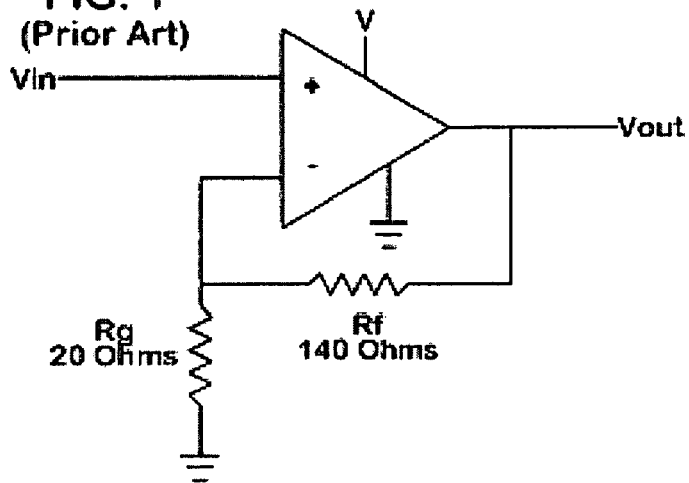
FIG. 1 shows a prior art non-inverting feedback amplifier circuit.

While the specification concludes with claims defining the features of the invention that are regarded as novel, it is believed that the invention will be better understood from a consideration of the following description in conjunction with the drawing figures.

To linearize the gain of the operational amplifier shown in FIG. 1 in accordance with an embodiment of the invention, the gain needs to be increased when the output voltage becomes greater than approximately 2V, and also when it is less than approximately −2V. One way, in accordance with an embodiment of the present invention to accomplish this linearization is to alter the resistance value of either Rf or Rg as a function of voltage. In this particular case, the gain needs to be increased for larger output voltages. To do this, Rf needs to be increased or Rg needs to be decreased. In an illustrative example, Rg is decreased. In particular, there should to be little effect on Rg in the range of −2V to +2V which we will referred to as the substantially error free range, but beyond this range in both the positive and negative directions, the gain needs to be increased by approximately 5%. To achieve this, the resistance value Rg needs to be effectively reduced by approximately 5.4%. As mentioned before, in an alternative embodiment, the resistance value of Rf needs to be increased.

Figure 3:
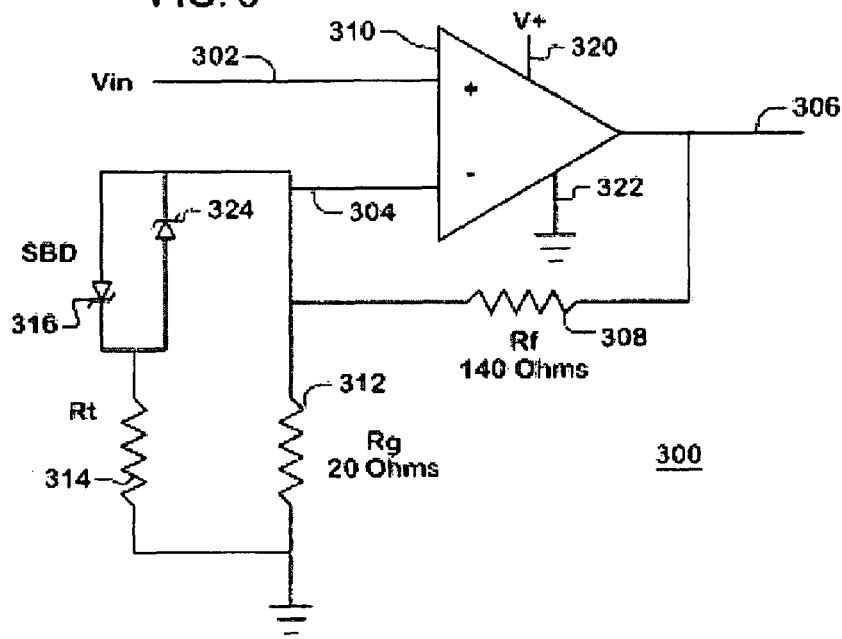
FIG. 3 shows an amplifier in accordance with an embodiment of the invention.

FIG. 3 show how this correction is achieved in accordance with one embodiment of the invention. The amplifier circuit shown in FIG. 3 uses an amplifier 310 having operating voltage 320 and ground 322 connections. Amplifier 310 includes a first amplifier input or non-inverting input 302 and a second amplifier input or inverting input 304, as well as an output 306. As in the amplifier circuit in FIG. 1, two amplifier gain setting resistors comprise a feedback resistor, Rf 308, and a second resistor, Rg 312 coupled between the second amplifier input 304 and ground are also found in the amplifier circuit 300. In one embodiment the amplifier circuit 300 uses Schottky barrier diodes (SBDs) 316, 324 in parallel, with opposing polarity connected together, in series with a trimming resistor (Rt) 314 which is placed in parallel with Rg (312). Basically, the diodes exhibit higher impedance when there is a small voltage across them, but as the voltage increases, their impedance drops. This lower impedance is in series with Rt and the overall combination of the diodes 316, 324 and trimming resistor 314 are now in parallel with Rg 312, which will lower its effective resistance value (using the well-known formula for calculating the resistance of parallel resistors) thus increasing the gain.

In a particular example, amplifier 310 comprises a Cadeka KH563 driver amplifier which was found to have a closedloop gain that was not linear over different amplitudes. This could be due to input bias current issues, internal design characteristics, open-loop gain or temperature sensitive internal components, etc. In this particular case, the gain decreased when going from small swings (like 4Vp–p) to large swings (like 20Vp–p) by about 5% overall.

Figure 2:
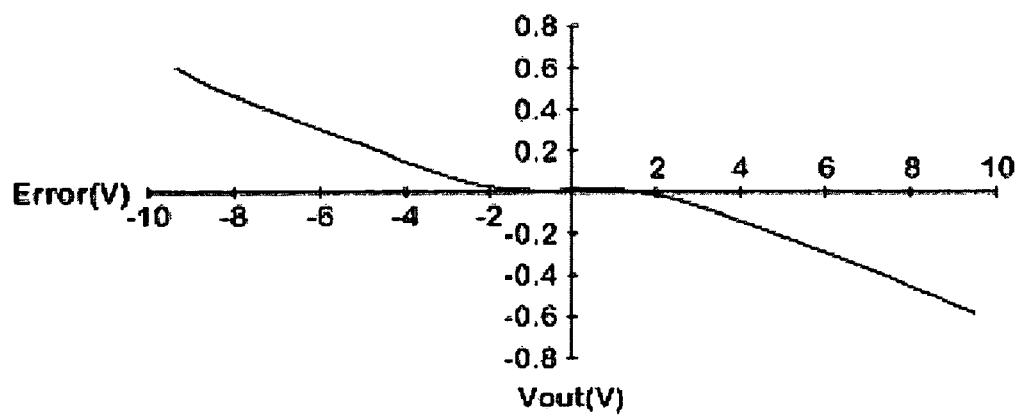
FIG. 2 shows a graph plotting Vout error as a function of expected output voltage for one illustrative example of the circuit of FIG. 1.

Schottky Barrier diodes were chosen in the case of the amplifier circuit of FIG. 3 because they will begin turning on at a lower voltage than a standard signal diode. This was used for this particular embodiment because we want to begin turning on the diodes 316 and 324 when the output is approximately 2V given the Vout error characteristics shown in FIG. 2 since that is when the voltage error starts increasing. Since the gain of the amplifier in FIG. 3 is approximately 8, the voltage where we want the diode to turn on is $\frac{1}{8}^{th}$ of 2V or approximately 0.25V. This is approximately where a typical SBD begins to turn on and is thus a good solution for this particular embodiment.

Figure 4:
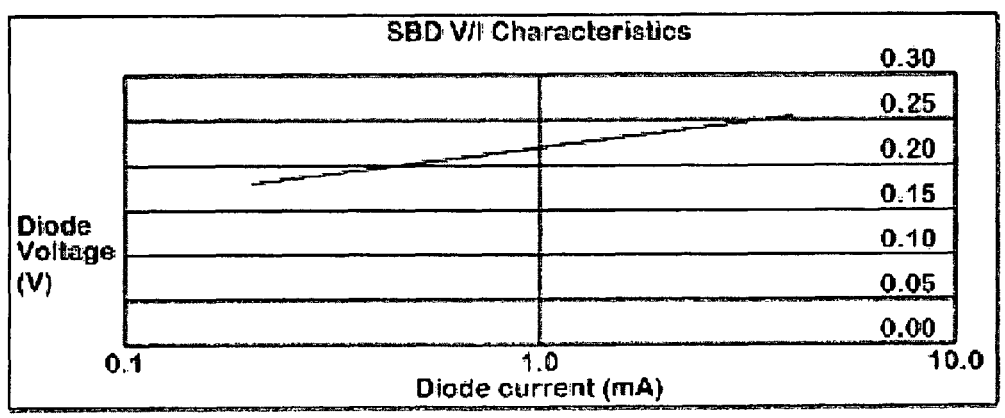
FIG. 4 shows a graph highlighting V/I characteristics of a Schottky barrier diode in range of interest.

We would have liked the SBD to drop its impedance quickly so that the resultant parallel resistance above +/−2V is simply Rt. Unfortunately, this is not the case. First off, we're not in the range where a SBD will be more solidly on (typically, a SBD is specified for a forward current of >10 mA). Thus, the diode will have significant amount of impedance in the range of interest. Thus, we'll need to reduce Rt 314 accordingly so that the sum of the two impedances will come out to be around the value of parallel resistance we'd desire for this particular example. FIG. 4 shows the V/I (voltage/current) characteristics of a typical SBD in the range of interest.

From our example, we'd like to lower Rg 312 by approximately 5.4% at an output voltage of +/−10V. This would require the series combination of the diode impedance and Rt 314 to be approximately 350 ohms. At this +/−10V output voltage, we'd have approximately $\frac{1}{8}^{th}$ of it (+/−1.25V) across the parallel combination of Rg 312 and the series combination of the parallel SBDs 316, 324 and Rt 314. With 1.25V across the series combination of the SBD diode impedance (Zd) and Rt, the current flow is approximately 3.6 mA. This current is found on the plot in FIG. 4, but it's hard to read off Vd.

Table 1 below shows the data from the graph of FIG. 4, in tabular form, along with the equivalent impedance of the diode (Zd) as a function of current.

TABLE 1

| Id | Vd | Zd |
|---|---|---|
| 4.0 | 0.26 | 64.53 |
| 3.8 | 0.26 | 67.60 |
| 3.6 | 0.26 | 71.00 |
| 3.4 | 0.25 | 74.77 |
| 3.2 | 0.25 | 78.99 |
| 3.0 | 0.25 | 83.75 |
| 2.8 | 0.25 | 89.14 |
| 2.6 | 0.25 | 95.32 |
| 2.4 | 0.25 | 102.46 |
| 2.2 | 0.24 | 110.83 |
| 2.0 | 0.24 | 120.78 |
| 1.8 | 0.24 | 132.80 |
| 1.6 | 0.24 | 147.64 |
| 1.5 | 0.23 | 156.46 |
| 1.4 | 0.23 | 166.46 |
| 1.2 | 0.23 | 191.13 |
| 1.1 | 0.23 | 206.62 |
| 1.0 | 0.23 | 225.00 |
| 0.9 | 0.22 | 247.20 |
| 0.8 | 0.22 | 274.59 |
| 0.7 | 0.22 | 309.26 |
| 0.6 | 0.21 | 354.66 |

TABLE 1-continued

| Id | Vd | Zd |
|---|---|---|
| 0.5 | 0.21 | 416.89 |
| 0.4 | 0.20 | 507.78 |
| 0.3 | 0.20 | 654.14 |
| 0.2 | 0.19 | 932.78 |

From Table 1, one can determine the impedance Zd for a current of 3.6 mA. It is approximately 71 ohms. Now at this same 3.6 mA, we want the series combination of the SBD diode impedance (Zd) and Rt to be approximately 350 ohms. Thus we need Rt=279 ohms (350 ohms−71 ohms).

Figure 5:
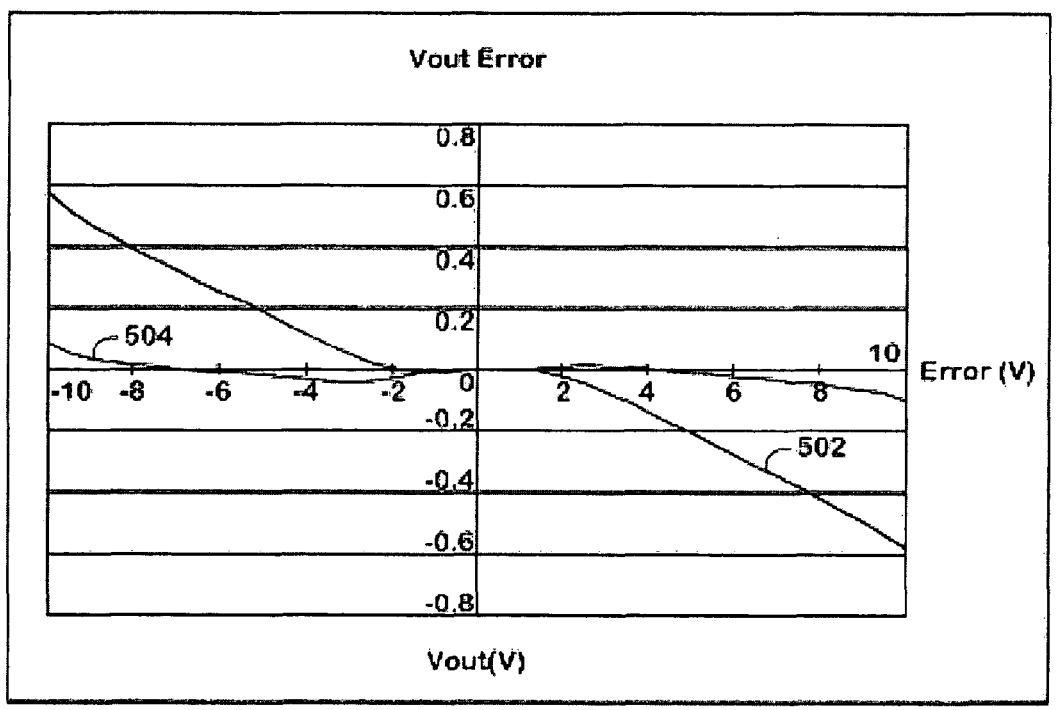
FIG. 5 shows a graph highlighting the Vout error for the amplifier shown in FIG. 3 versus the amplifier shown in FIG. 1.
Figure 6:
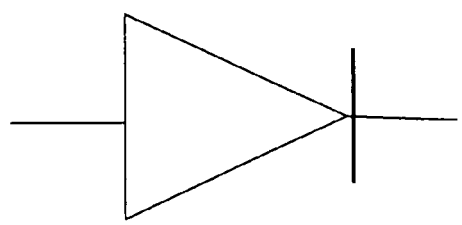
FIG. 6 shows a signal diode in accordance with an embodiment of the invention.
Figure 7:
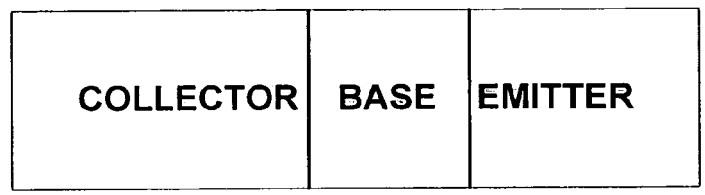
FIG. 7 shows a block diagram of a transistor highlighting the collector-base and base-emitter transistor junctions in accordance with an embodiment of the invention.

Using this value of Rt in FIG. 3, the gain is indeed increased, and the resultant error is shown in FIG. 5 in graph line 504, along with the original error graph line 502. Looking at the plot, though, we see that the method applied and discussed above wasn't perfect, but certainly helped reduce the error considerably as shown in graph line 504 as compared to line 502. There is somewhat of a balance between positive and negative error, which seems better than having all of the error in one direction. Also, a slightly greater error at the extremes is probably more easily tolerated than for the central operating region of the amplifier circuit. Thus, if the error can't be totally eliminated, this result is certainly a good compromise for some designs since the voltage error is improved substantially.

The selection of different SBD diodes 316, 324 or value for trimming resistor Rt 314 could potentially reduce the error further but could require potentially more trial and error selection. The nature of the original error characteristics is the primary factor in determining how best to correct for the amplifier's gain error.

If the amplifier is to be used for high frequency applications such as is common when designing some test systems, the diode(s) must have appropriately fast reverse recovery times and minimal transition capacitances. If the transition capacitance is too high, for example, it will reduce Zd during fast transitions, increasing the gain further and thus cause a peaking effect on Vout which is not desirable.

In other embodiments of the invention, and depending on the characteristics of the amplifier's gain error, the use of a diode or other electronic device having the non-linear V/I characteristics as a diode, in series or in parallel with a resistor and then using this in series or in parallel with either resistors Rf or Rg would not depart from the spirit of this invention. Nor would the type or quantity of diodes being used. For example, one might want to use diodes in series or in parallel to achieve specifically desired V/I characteristic. Possibly even diodes with different V/I characteristics can be used in other embodiments.

For example, in an alternative embodiment a signal diode (or more than one) can be used instead of SBDs 316 and/or 324 as shown in FIG. 3. Silicon (typical forward voltage drop of 0.6-0.7 volt) or germanium (0.2-0.3 volt) signal diode(s) can be used depending on the particular design needs. Diodes are not the only type of semiconductor devices that can be utilized. In another embodiment, a transistor junction may also provide an appropriate non-linear V/I characteristic to compensate for Vout error of an amplifier and can be used in place of a diode.

Furthermore, the use of several such gain linearization circuits on the same amplifier to correct for different portions of the gain error would also be within the spirit of this invention. For example, by having the diodes 314 and 316, each with its own dedicated Rt resistor, would allow one to correct for non-symmetrical gain errors. Also, whether the amplifier circuit being corrected for is a voltage feedback or current feedback amplifier circuit would also be within the scope of this invention.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An amplifier circuit, comprising:
   an amplifier having a non-linear gain characteristic, and an input port and an output port;
   a first gain setting resistor coupled between the input port and the output port of the amplifier;
   a second gain setting resistor coupled between the input port and ground;
   a gain linearization circuit coupled between the input port and ground, the gain linearization circuit including a non-linear device having non-linear voltage to current (V/I) characteristic, the gain linearization circuit improving the non-linear gain characteristic of the amplifier; and
   a resistor coupled in series between the non-linear device and ground.

2. An amplifier circuit as defined in claim 1, wherein the non-linear device comprises a signal diode.

3. An amplifier circuit as defined in claim 1, wherein the non-linear device comprises a Schottky Barrier diode (SBD).

4. An amplifier circuit as defined in claim 1, wherein the non-linear device includes a transistor junction.

5. An amplifier circuit as defined in claim 1, wherein the non-linear device comprises at least two diodes coupled in parallel with their opposing polarity coupled together.

6. An amplifier circuit as defined in claim 5, wherein the resistor is coupled in series to the at least two diodes.

7. An amplifier circuit as defined in claim 5, wherein the at least two diodes and the resistor are coupled in parallel with the second amplifier gain setting resistor.

8. An amplifier circuit as defined in claim 5, wherein the at least two diodes and the resistor are coupled in series with the second amplifier gain setting resistor.

9. An amplifier circuit, comprising:
   an operational amplifier having a non-linear gain characteristic, and first and second differential input ports and an output port;
   a gain setting resistor coupled between the first differential input port and the output port of the operational amplifier; and
   a gain linearization circuit coupled between the first differential input port and ground, the gain linearization circuit including at least one diode coupled to the first gain setting resistor, the gain linearization circuit helping to linearize the non-linear gain characteristic of the operational amplifier over an operating range, and a trimming resistor coupled in series to the at least one diode.

10. An amplifier circuit as defined in claim 9, wherein the gain linearization circuit includes at least two diodes coupled in parallel.

11. An amplifier circuit as defined in claim 10, wherein the at least two diodes comprise diodes coupled in parallel with their opposing polarities connected together.

12. An amplifier circuit as defined in claim 11, wherein the linearization circuit helps to linearize the non-linear gain characteristic of the operational amplifier by adjusting the resistance of the gain setting resistor over at least a portion of the operating range.

13. An amplifier circuit as defined in claim 12, wherein the resistance of gain setting resistor is lowered by the linearization circuit.

14. An amplifier circuit as defined in claim 12, wherein the resistance of the gain setting resistor is increased by the linearization circuit.

15. A method for linearizing a non-linear amplifier that includes an input port and at least one resistive element that sets the gain of the amplifier, and including a gain linearization circuit coupled between the input port and ground, the gain linearization circuit having gain altering components having a non-linear voltage to current (V/I) characteristic, the gain altering components comprise one or more diodes and at least one resistor coupled between the one or more diodes and ground, the method comprising adjusting the gain of the non-linear amplifier using the gain linearization circuit.

16. A method as defined in claim 15, wherein the non-linear amplifier comprises an operational amplifier.

17. A method as defined in claim 15, wherein the gain altering components comprise two diodes coupled in parallel with their opposing polarities connected together.

* * * * *